United States Patent
Lin

(10) Patent No.: US 7,161,391 B2
(45) Date of Patent: Jan. 9, 2007

(54) SKEW TOLERANT HIGH-SPEED DIGITAL PHASE DETECTOR

(75) Inventor: Feng Lin, Boise, ID (US)

(73) Assignee: Micron Technology, Boise, ID (US)

( * ) Notice: Subject to any disclaimer, the term of this patent is extended or adjusted under 35 U.S.C. 154(b) by 2 days.

(21) Appl. No.: 11/003,117

(22) Filed: Dec. 3, 2004

(65) Prior Publication Data

US 2006/0119396 A1 Jun. 8, 2006

(51) Int. Cl.
*G01R 25/00* (2006.01)
(52) U.S. Cl. .............................................. 327/3; 327/5
(58) Field of Classification Search .................... 327/2, 327/3, 5, 7–10, 12, 147, 155, 156; 331/17, 331/25; 375/375, 376
See application file for complete search history.

(56) References Cited

U.S. PATENT DOCUMENTS

| | | | |
|---|---|---|---|
| 6,198,355 B1* | 3/2001 | Lindquist et al. | 331/27 |
| 6,239,627 B1* | 5/2001 | Brown et al. | 327/116 |
| 6,249,188 B1* | 6/2001 | Kaneko | 331/17 |

* cited by examiner

*Primary Examiner*—Linh My Nguyen
(74) *Attorney, Agent, or Firm*—Fletcher Yoder

(57) ABSTRACT

A skew-tolerant digital phase detector is provided. Specifically, a detector is provided in the digital phase detector to detect certain failure conditions that may result from clock skew and duty cycle distortion. If the condition is detected, an adjusted signal is generated and the adjusted signal is synchronized with the reference signal. By using the generated signal to provide a lock if certain conditions arise, adjustment errors resulting from duty cycle distortion and clock skew can be minimized.

30 Claims, 4 Drawing Sheets

SKEW TOLERANT HIGH-SPEED DIGITAL PHASE DETECTOR

BACKGROUND OF THE INVENTION

1. Field of the Invention

The present invention relates generally to digital phase detectors and, more particularly, to digital phase detectors having tolerance for duty cycle distortion and clock skew.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Digital phase detectors (DPDs) are widely used to compare the respective phases of two input signals. For instance, DPDs may be used in synchronization circuits, such as delay lock loops (DLLs) or phase lock loops (PLLs), to compare input signals such that they may be synchronized or "locked." By comparing a reference signal, such as a clock signal, to a feedback signal using a DPD, phase adjustments may be made to one or both of the input signals based on the comparison of the input signals, in order to synchronize the signals. As will be appreciated, synchronization of certain signals within a device or system is often advantageous. In alternate applications, phase detectors may also be used to for duty cycle correction and in calibration circuits, for instance.

As will be appreciated, phase detectors are generally configured to provide a certain period of time known as the "lock window" or "detection window" to indicate when the input signals are synchronized or locked. A lock window may be implemented to account for set-up time and process voltage temperature (PVT) variations. At high speeds, the input signals may become distorted and the duty cycle may become something other than a 50% duty cycle. Once the speed of the input signal, which may be a clock signal, exceeds 1 GHz, the lock window, which may be on the order of 300 picoseconds to 400 picoseconds, may encompass 30–40% of the entire duty cycle. Thus, as clock speeds increase, clock skew and duty cycle distortion have an increasingly proportionate impact on phase locking. For high-speed operations, duty cycle distortion and clock skew may adversely affect synchronization. Disadvantageously, the clock skew and duty cycle distortion may be such that in high-speed operation, a device receiving output signals from the DPD which have been produced based on distorted or skewed input signals, may incorrectly adjust one or both of the input signals based on an erroneous output from the DPD. By adjusting one or both of the phases of the input signals in the wrong direction, the locking time may be disadvantageously increased.

Embodiments of the present invention may address one or more of the problems set forth above.

BRIEF SUMMARY

Embodiments of the invention provide an improved digital phase detector that may prevent locking errors in high-speed applications. A detector is provided in the digital phase detector to detect certain failure conditions that may result from clock skew and duty cycle distortion. If the condition is detected, an adjusted signal is generated and the adjusted signal is synchronized with the reference signal. By using the generated signal to provide a lock if certain conditions arise, adjustment errors resulting from duty cycle distortion and clock skew can be minimized. Accordingly, a skew-tolerant digital phase detector is provided.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Digital phase detectors (DPDs) are widely used in synchronization circuits, such as delay locked loops (DLLs) and phase locked loops (PLLs), to provide a comparison between the phase relationship of two input signals. Many electronic systems use internal clocks which may require phase alignment and/or frequency alignment to an external reference clock. For example, a central processing unit implemented in a computer system may have an internal clock with an operating speed of 2.4 GHz which must be aligned to a bus clock running at a frequency of 100 MHz. As will be appreciated, phase alignment is important to ensure that data is exchanged reliably between circuits in the 2.4 GHz domain and circuits in the 100 MHz domain. DLLs and PLLs use digital phase detectors to come compare an input clock signal to a feedback signal such that the signals can be synchronized. DLLs and PLLs may be used in many devices, such as synchronous random access memory (SRAM) devices, that may be implemented in a system, such as a computer system.

Figure 1:
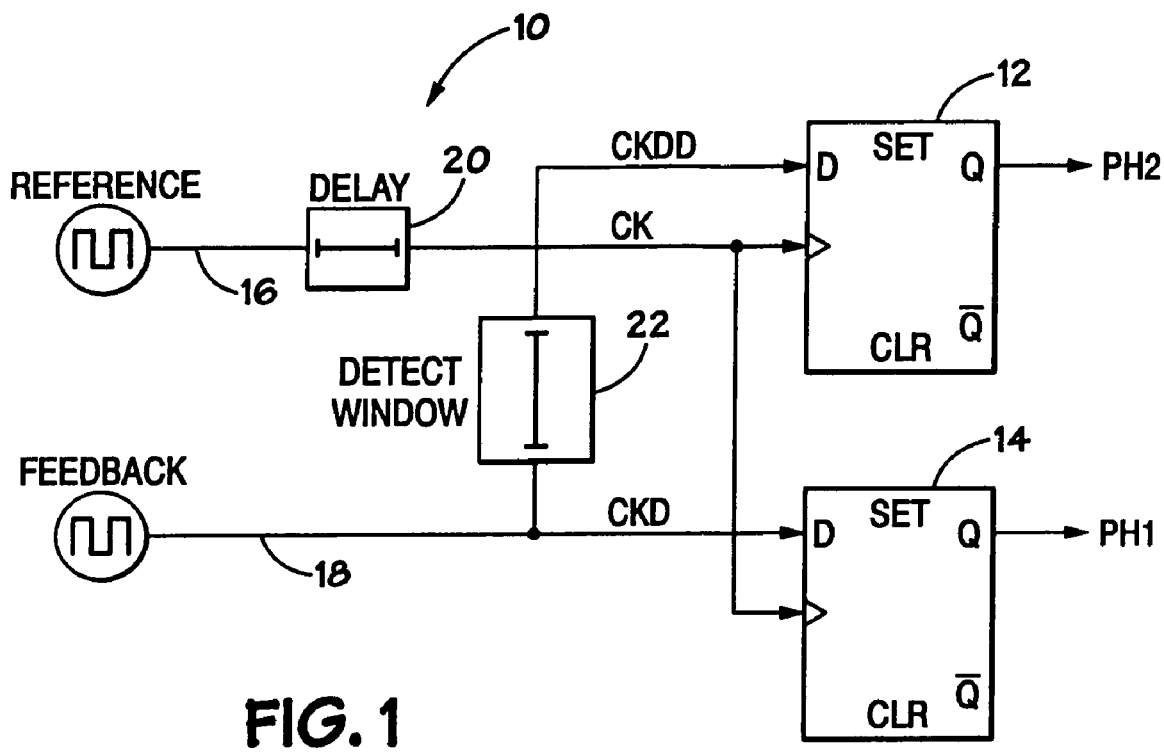
FIG. 1 illustrates a block diagram of a conventional digital phase detector.

Referring now to FIG. 1, a conventional DPD is illustrated, and generally designated by the reference numeral 10. The phase detector 10 includes flip-flops 12 and 14. As will be appreciated, the phase detector 10 is configured to receive input signals 16 and 18 to compare the phase relationship of the two input signals 16 and 18. The input signals 16 and 18 may be a reference signal received from and external clock and a feedback signal received from a feedback path of a DLL or PLL, for example. Each flip-flop 12 and 14 will provide an output signal PH2 and PH1, respectively. Depending on the state of the output signals PH2 and PH1, a determination may be made as to what direction (i.e., left or right) the input signal 16 (and/or input signal 18) should be shifted to synchronize the input signals 16 and 18. For example, a shift register may be coupled to the outputs of the phase detector. The shift register may be configured to add delay or remove delay (i.e., shift left or shift right) from one of the input signals. Table 1 illustrates state truth table describing the function or action that should be taken based on the state of the output signals PH2 and PH1:

TABLE 1

| PH1 | PH2 | Function |
| --- | --- | --- |
| 0 | 0 | remove delay (shift right, SR) |
| 0 | 1 | add delay (shift left, SL) |
| 1 | 1 | add delay (shift left 180°, SL) |
| 1 | 0 | no delay (input signals locked/synchronized) |

The clock input of each flip-flop 12 and 14 receives the clock signal (CK). The clock signal CK represents the reference signal having a delay added thereto to compensate for the setup time of the flip-flops 12 and 14. Accordingly, a delay element 20 may be provided to compensate for the setup time by generating the clock signal CK. The delay element 20 may include two to four delay elements that add total of 200 picoseconds to the reference signal. As will be appreciated, the delay element 20 may include any desirable number of delay elements and may be configured to provide any desirable amount of delay to the references signal, depending on the setup time of the flip-flops 12 and 14.

As will be appreciated, in typical phase detectors, such as the phase detector 10, the data pin on the flip-flop 14 receives the feedback signal, also referred to herein as the signal CKD. The flip-flop 12 receives a delayed feedback signal CKDD at the data pin. The delayed feedback signal CKDD is the feedback signal delayed by a certain time via the delay element 22. The delay element 22 is used to add a delay to provide a detection window for locking the reference signal to the feedback signal (signal CKD). Accordingly, the delay element 22 may be configured to provide a desired detection window. As will be appreciated, the delay element 22 may be larger or smaller depending on the desired resolution of the phase detector 10. A narrow detection window provides a tighter tolerance and more resolution in the phase detection. The phase detection and synchronization of the phase detector 10 may be better understood by turning to the timing diagrams illustrated in FIG. 2.

Figure 2:
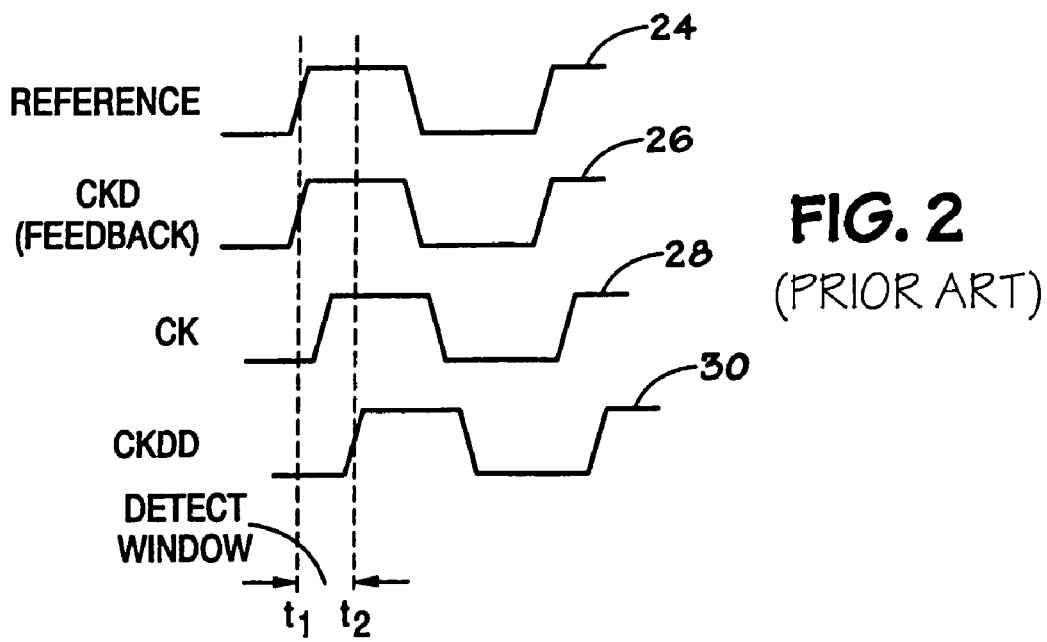
FIG. 2 is a timing diagram illustrating phase detection of the circuit illustrated in FIG. 1.

FIG. 2 illustrates each of the signals described with reference to FIG. 1. The reference signal, the feedback signal (signal CKD), the clock signal CK and the delayed feedback signal CKDD are illustrated and generally designated by the reference numbers 24, 26, 28 and 30, respectively. As previously described, a detection window is provided by the delay element 22 and defined as the time period between the rising edge of the feedback signal CKD (t1) and the rising edge of the delayed feedback signal CKDD (t2). When the rising edge of the clock signal CK is between time t1 and time t2 (i.e., in the detect window), the outputs PH1 and PH2 will be a logical 1 and a logical 0, respectively, and the digital phase detector 10 is locked.

During operation, and especially high speed operation, clock skew and duty cycle distortion of the delayed feedback signal CKDD may create a condition where the outputs PH1 and PH2 indicate the wrong condition. As previously discussed, clock skew generally refers to delays in the rise or fall time of the signal. Clock skew may be caused by the PVT variations or by inherent qualities associates with the NMOS/PMOS device. Duty cycle distortion refers to the duty cycle being morphed to something other than a 50% duty cycle. Duty cycle distortion may be caused by unequal rise and fall times of a signal, such as a clock signal and may be caused by PVT variations, for instance.

Figure 3:
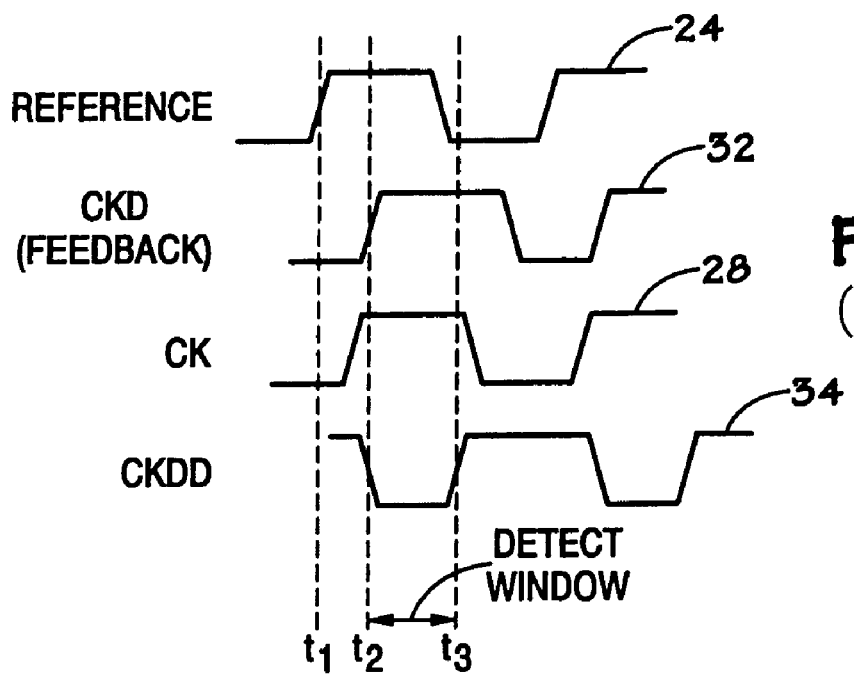
FIG. 3 is a timing diagram illustrating a potential failure mechanism associated with the digital phase detector of FIG. 1.

FIG. 3 illustrates the error condition described above, wherein duty cycle distortion may produce outputs that indicate the wrong function or action to be taken (i.e., adding or removing delay). As illustrated in FIG. 3, the reference signal 24 and the clock signal CK 28 are the same as those illustrated in FIG. 2. However, the feedback signal CKD, indicated by reference numeral 32, and therefore the delayed feedback signal CKDD, indicated by reference numeral 34, have a distorted duty cycle (greater than 50%). The duty cycle distortion of these signals results in a detection window between time t2 and time t3, wherein the clock signal CK 28 is logically high. This condition will produce outputs PH1 and PH2 which will indicate the wrong action. Thus, in the case where the falling edge of the delayed clock signal CKDD 34 is close to the rising edge of the feedback signal CKD 32 due to the duty-cycle distortion and short cycle time during high speed operation, the digital phased detector 10 will generate output signals of PH1=0 and PH2=1, indicating that delay should be added to the feedback signal CKD. However, as will be appreciated, because the reference signal 24 leads the feedback signal CKD 32, the appropriate action would be to remove delay from the feedback signal CKD.

Figure 4:
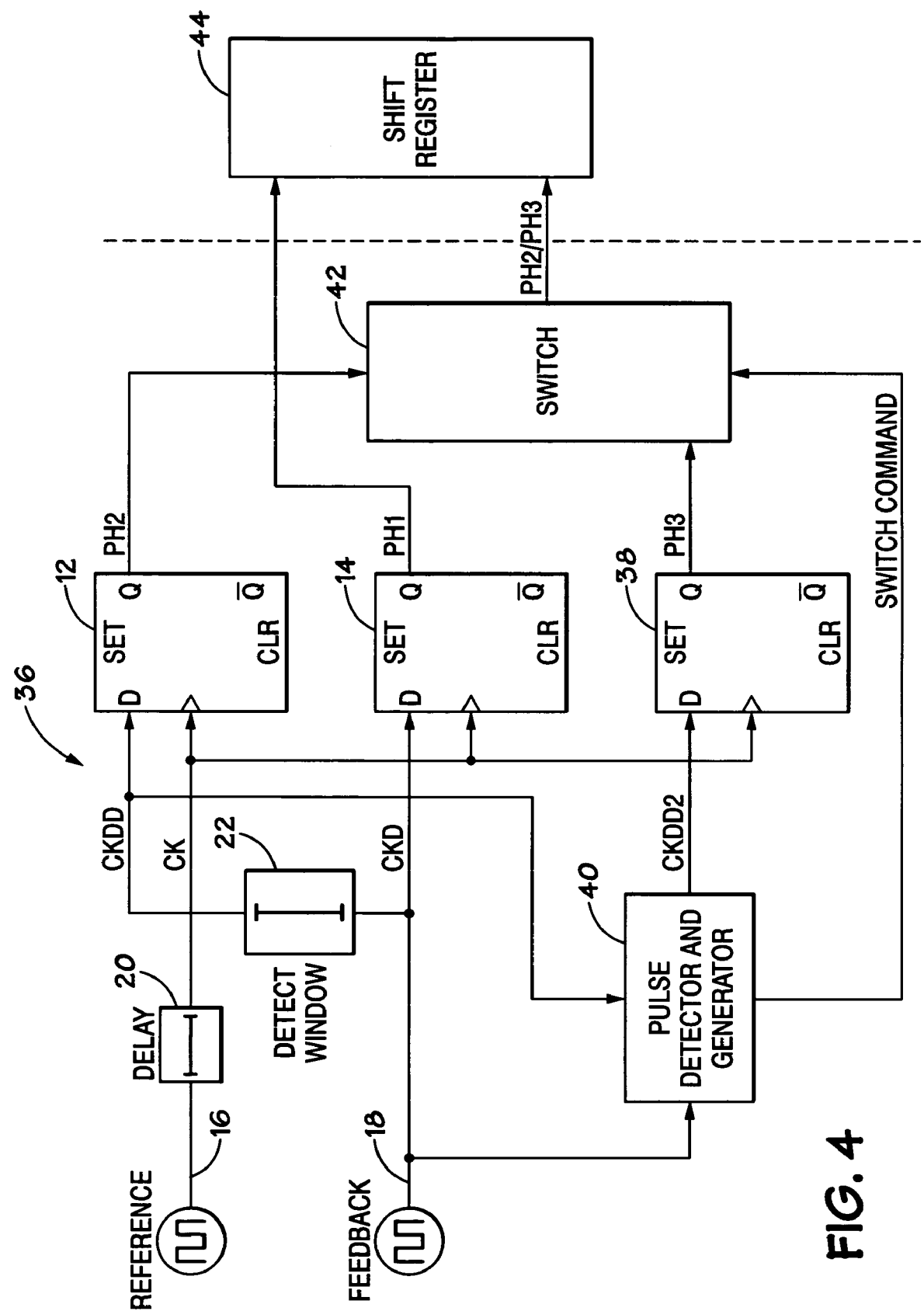
FIG. 4 is a block diagram of an improved digital phase detector in accordance with embodiments of the present invention.

Referring now to FIG. 4, an improved digital phase detector 36 that solves the error condition illustrated with respect to FIG. 3 and the phase detector 10 is illustrate. For simplicity, like reference numerals have been used to designate elements present in the digital phase detector 10 and previously discussed. In addition to the elements previously described with respect to the phase detector 10, the phase detector 36 includes an additional flip-flop 38, a pulse detector and generator block 40 and a switch 42. Generally, the improved DPD 36 uses a pulse detector to detect the potential for the failure condition described above. In other words, the pulse detector receives each of the feedback signal CKD and the delayed feedback signal CKDD and determines whether the falling edge of the delayed feedback signal CKDD is close to the rising edge of the feedback signal CKD. If the pulse detector determines that the edges of the signals are close, a pulse generator generates a new delayed feedback signal CKDD2, having an adjusted duty cycle and sends a switch command to the switch 42 indicating that the output PH3 from the flip-flop 38 (rather than the output PH2 from the flip-flop 12) should be used to determine the appropriate action. If the time difference between the falling edge of the delayed feedback signal CKDD and the rising edge of the feedback signal CKD is within the defined period, the switch 42 is set such that the output of the switch 42 provides the output signal PH3.

The defined period is determined by the setup time needed for the flip-flop 38. By using the setup time of the flip-flop 38 to trigger the correction mechanism (i.e., generation of a new output signal PH3), the failure mechanism may be avoided. In one exemplary embodiment, the setup time for the flip-flop 38 may be approximately 100 picoseconds, for example. Accordingly, if the pulse detector detects that the falling edge of the delayed feedback signal CKDD is within 100 ps of the rising edge of the feedback signal CKD, the switch 42 is triggered. In this case, the output signals PH1 and PH3 will be implemented to determine the appropriate action. If the time difference is not within the defined period (i.e., outside the potential failure range), the switch 42 is set such that the output of the switch 42 provides the output signal PH2. In this case, the output signals PH1 and PH2 will be implemented to determine the appropriate course of action.

It should be understood that while the present exemplary embodiment illustrates the pulse detector and pulse generator are by a single pulse detector and generator block 40, in alternate embodiments, the pulse detector and pulse generator may be separate elements. Regardless, any device capable of detecting the time difference between the falling edge of the delayed feedback signal CKDD and the rising edge of the feedback signal CKD may be used. Further, any device capable of generating a new delayed feedback signal CKDD2 may be used, if the time differential is within a certain range. As discussed further with reference to FIG. 6, the output signals PH1 and PH2/PH3 may be transmitted to a shift register 44 such that delay may be added or removed from the feedback signal CKD. In this embodiment, the shift register 44 may include logic to interpret the output signals PH1 and PH2/PH3 and convert them into shift commands, such as shift right (SR), shift left (SL) or no shift (NS). Alternative, the conversion logic may be included in the DPD 36 or in a separate circuit provided between the DPD 36 and the shift register 44.

Figure 5:
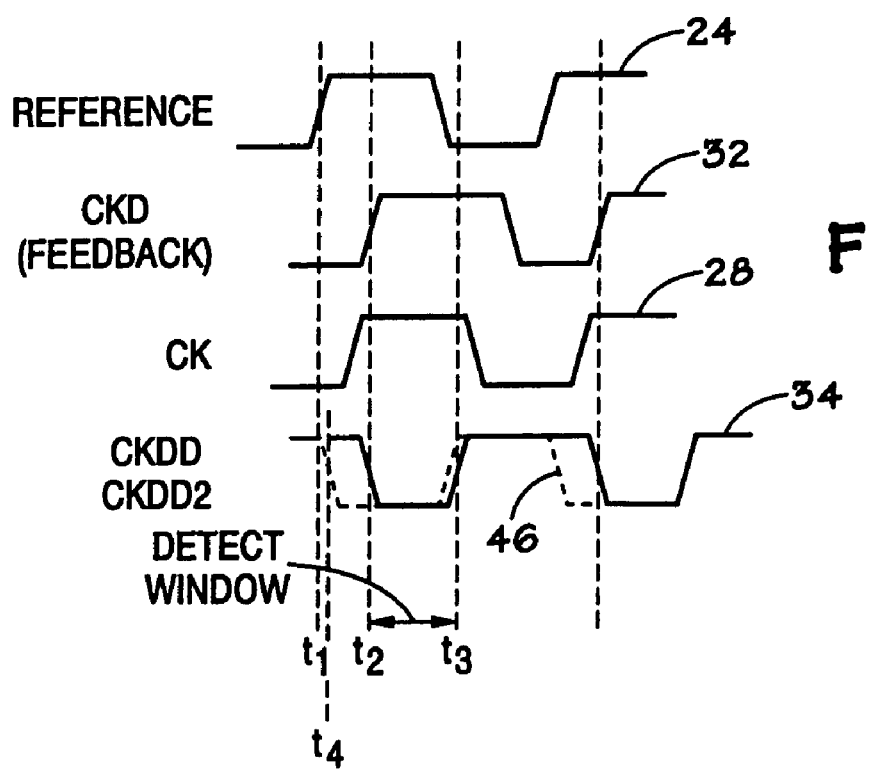
FIG. 5 is a timing diagram corresponding to the improved digital phase detector of FIG. 4.

The operation of the improved DPD 36 may be further illustrated with respect to FIG. 5. FIG. 5 illustrates a timing diagram of the signals previously described with reference to FIG. 3. In addition, the new delayed feedback signal CKDD2, indicated by the reference numeral 46, generated by the pulse generator of the pulse detector and generator block 40 and having an adjusted duty cycle is illustrated. The pulse generator generates the new delayed feedback signal CKDD2 to avoid the failure condition described above. In the present exemplary embodiment, the pulse generator generates a signal having a duty cycle of less than 50% to ensure that the falling edge of the delayed feedback signal CKDD does not transition from high to low, while the clock signal CK transition from low to high. Here, the falling edge of the delayed feedback signal CKDD is moved such that the new delayed feedback signal CKDD2 falls at time t4, rather than time t2. By adjusting the duty cycle and producing a new delayed feedback signal CKDD2 which falls before the clock signal CK rises, the failure mechanism is avoided. If the new feedback signal CKDD2 is generated based on detection of the time difference within the defined period, the switch 42 is set such that the output PH3 corresponding to the new delayed feedback signal CKDD2 is used to determine the correct action to be taken, rather than the output PH2 corresponding to the delayed feedback signal CKDD.

Figure 6:
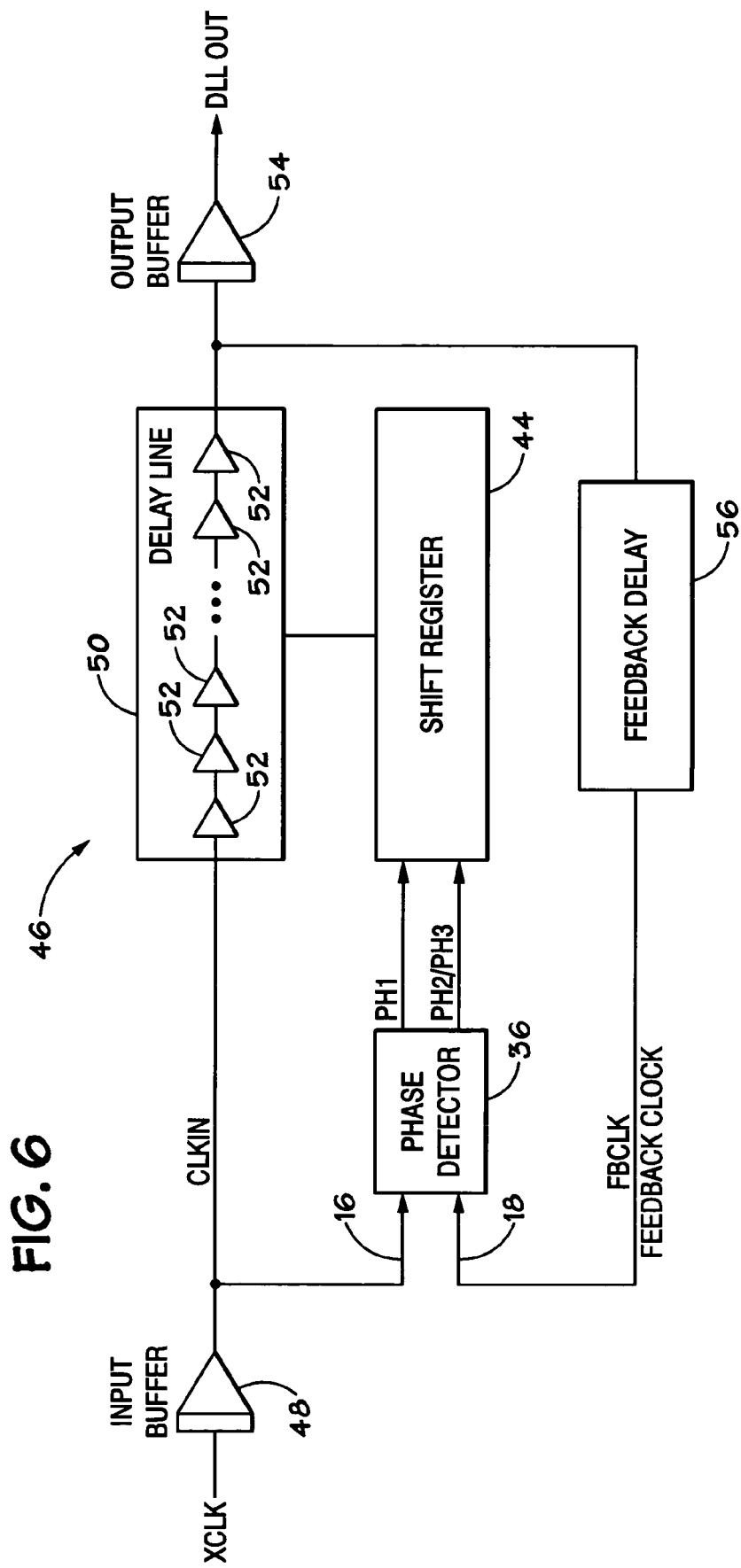
FIG. 6 is a block diagram of a delay locked loop which may utilize the digital phase detector of FIG. 4 in accordance with embodiments of the present invention.

An exemplary embodiment of a delay locked loop (DLL) 46, incorporating the improved DPD 36, is illustrated in FIG. 6. As will be appreciated, the DLL 46 may be implemented to synchronize timing signals in a synchronous dynamic random access memory device (SDRAM), for instance. As previously described, differences in alignment between signals having the same frequency may arise due to propagation delays inherent in each of the various components in the system through which the signal of interest passes as well as propagation delays caused by varying lengths of signal buses in the system. For example, it may be desirable to drive various components in the system with a reference clock signal generated by an external source and to obtain an output signal from the driven components which is synchronous with the reference clock signal. To reach the various components, the reference clock signal may be transmitted through various buffers and buses of various lengths. Thus, when received at the input pin of a particular component, the clock signal may no longer be aligned (i.e., is out of phase) with the reference clock signal.

In the DLL circuit 46 illustrated in FIG. 6, a reference signal such as an external clock signal XCLK is received by an input buffer 48 and provided to a delay line 50 as a buffered clock signal CLKIN. The delay line 50 includes a number of delay elements 52, such as inverters. By providing a number of delay elements 52, the entry point of the buffered clock signal CLKIN may be adjusted to provide a lock through a range of frequencies, temperatures, voltages, etc. The output of the delay line 50 is connected to an output buffer 54 and a feedback delay circuit 56. The feedback delay circuit 56 provides a feedback clock signal (FBCLK) that is transmitted to the digital phase detector 36 for comparison with the buffered reference clock signal CLKIN. The phase detector 36 determines whether a difference exists between the phase of the feedback clock signal FBCLK and the buffered reference clock signal CLKIN. The detected difference determines the amount of delay to be introduced in or removed from the delay line 50 by a delay line control, such as the shift register 44, such that the buffered reference clock signal CLKIN may be shifted by an appropriate amount to produce an output clock signal DLLOUT that aligns, or locks, with the reference clock signal XCLK. While the present embodiment illustrates a shift register 44, any other suitable means of controlling the timing of the delay line 50, such as a state machine, a look-up table, a counter, etc. may be used. Further, while the present embodiment illustrates only an output buffer 54 in the output path of the delay line 50, it should be understood, that the output path may include other elements, such as a clock distribution or fanout circuit.

When the DLL circuit 46 has locked the data output signal DLLOUT to the reference clock signal XCLK, then essentially no difference should exist between the phases of the buffered clock signal CLKIN and the clock feedback signal FBCLK. The degree of acceptable phase difference will depend on the application and the precision of the DLL (i.e., the number and size of the delay elements 52 included in the delay line 50). Thus, a DLL is locked when the total delay in the forward path is equal to the total delay in the feedback path. Expressed another way:

$$d_{forward} = t_{input\ buffer} + t_{delay\ line} + t_{output\ buffer}$$

$$d_{feedback} = t_{delay\ line} + t_{feedback}$$

$$d_{forward} = d_{feedback}$$

where $d_{forward}$ corresponds to the delay between the reference clock signal XCLK and the data output signal DLLOUT; $d_{feedback}$ corresponds to the delay between the buffered clock signal CLKIN and the clock feedback signal FBCLK; $t_{inputbuffer}$ corresponds to the delay of the input buffer 48; $t_{delay\ line}$ corresponds to the delay in the delay line 50; $t_{output\ buffer}$ corresponds to the delay of the output buffer

54; and $t_{feedback}$ corresponds to the delay in the feedback delay circuit 56. Thus, to achieve phase lock, $$t_{feedback} = t_{input\ buffer} + t_{output\ buffer}$$

Thus, the feedback delay circuit 56 introduces delays in the feedback path corresponding to the delay ($t_{input\ buffer}$) introduced by the input buffer 48 and the delay ($t_{output\ buffer}$) introduced by the output buffer 54. Because $t_{feedback}$ is a constant, when the input changes frequency, the $t_{delay}$ line should change in response to the changing input. The phase detector 36 provides the shift register 44 with a shift left or shift right signal depending on whether the buffered clock signal CLKIN is too fast or too slow. The shift register 44 then shifts the entry point of the delay line 50 by one delay element. The process is repeated until the input signals to the phase detector 36 are phase equal and the DLL 48 is locked. As previously described, the shift action will be determined based on the state of the outputs PH1 and either PH2 or PH3, depending on the conditions described above.

While the invention may be susceptible to various modifications and alternative forms, specific embodiments have been shown by way of example in the drawings and have been describe in detail herein. However, it should be understood that the invention is not intended to be limited to the particular forms disclosed. Rather, the invention is to cover all modifications, equivalents and alternatives falling with in the spirit and scope of the invention as defined by the following appended claims.

What is claimed is:

1. A digital phase detector comprising:
    a first latch comprising a first clock input configured to receive a clock signal and comprising a first data input configured to receive a first input signal;
    a second latch comprising a second clock input configured to receive the clock signal and comprising a second data input configured to receive a second input signal, wherein the second input signal comprises the first input signal having a delay added thereto; and
    a third latch comprising a third clock input configured to receive the clock signal and comprising a third data input configured to receive a third input signal, wherein the third input signal comprises the second input signal having an adjusted duty cycle.

2. The digital phase detector, as set forth in claim 1, comprising a pulse detector configured to receive each of the first input signal and the second input signal and further configured to determine whether a falling edge of the second input signal is within a time differential of a rising edge of the first input signal, wherein the time differential is approximately equal to a setup time of the third latch.

3. The digital phase detector, as set forth in claim 1, comprising a pulse generator configured to generate the third input signal if a falling edge of the second input signal is within a time differential of a rising edge of the first input signal, wherein the time differential is approximately equal to a setup time of the third latch.

4. The digital phase detector, as set forth in claim 1, comprising a switch coupled to the output of the second latch and the output of the third latch and configured to provide a switch output comprising the output of the third latch if a falling edge of the second input signal is within a time differential of a rising edge of the first input signal and configured to provide a switch output comprising the output of the second latch if the falling edge of the second input signal is not within the time differential of a rising edge of the first input signal, wherein the time differential is approximately equal to a setup time of the third latch.

5. The digital phase detector, as set forth in claim 1, comprising a first delay element configured to add delay to a reference signal to compensate for processing, voltage and temperature (PVT) variations, wherein the reference signal having delay added thereto comprises the first input signal.

6. The digital phase detector, as set forth in claim 1, comprising a second delay element configured to add delay to the first input signal to create the second input signal, to provide a detect window in which phase matching may be detected.

7. The digital phase detector, as set forth in claim 1, wherein each of the first latch, the second latch and the third latch comprises a respective flip flop.

8. A digital phase detector comprising:
    a plurality of latches configured to produce a shift command in response to a phase comparison between a clock signal and a feedback signal;
    a detector configured to detect a minimum time between a rising edge of the feedback signal and a falling edge of a delayed feedback signal, wherein the delayed feedback signal comprises the feedback signal having delay added thereto;
    a pulse generator configured to adjust the falling edge of the delayed feedback signal, thereby providing an adjusted delayed feedback signal, if the minimum time detected by the detector is less than a time differential with respect to one another, such that the a falling edge of the adjusted delayed feedback signal precedes a rising edge of the clock signal.

9. The digital phase detector, as set forth in claim 8, comprising a switch configured to select between outputs of two of the plurality of latches, wherein the selection is based on the minimum time detected by the pulse detector and wherein the selected output is used to provide a phase lock.

10. The digital phase detector, as set forth in claim 8, wherein the plurality of latches comprises:
    a first latch comprising a first clock input configured to receive the clock signal and comprising a first data input configured to receive the feedback signal;
    a second latch comprising a second clock input configured to receive the clock signal and comprising a second data input configured to receive the delayed feedback signal;
    a third latch comprising a third clock input configured to receive the clock signal and comprising a third data input configured to receive the adjusted delayed feedback signal; and
    wherein the time differential is approximately equal to a setup time of the third latch.

11. The digital phase detector, as set forth in claim 8, comprising a delay element configured to add delay to the feedback signal to provide the delayed feedback signal to provide a detect window in which phase matching may be detected.

12. A phase detector comprising:
    a plurality of latches configured to receive input signals, wherein each of the plurality of latches provides a respective output and wherein the outputs from at least two of the plurality of latches are used to determine whether the input signals are phase matched;
    a detection device configured to measure a time differential between a rising edge of a first of the input signals and a falling edge of a second of the input signals, wherein the rising edge of the first input signal and a falling edge of the second input signal provide a detect window for detecting a phase match of the first input signal with an external clock signal; and a switching device coupled to the detection device and configured to determine which of the plurality of latches are used to determine whether the input signals are phase matched.

13. The phase detector, as set forth in claim 12, comprising a device configured generate a third input signal if the time differential detected by the detector is less than a time differential, such that the a falling edge of the third input signal precedes a rising edge of the external clock signal, wherein the time differential is approximately equal to a setup time of the third latch.

14. The digital phase detector, as set forth in claim 12, wherein the plurality of latches comprises:
   a first latch comprising a first clock input configured to receive the external clock signal and comprising a first data input configured to receive the first input signal;
   a second latch comprising a second clock input configured to receive the clock signal and comprising a second data input configured to receive the second input signal, wherein the second input signal comprises the first input signal having a delay added thereto; and
   a third latch comprising a third clock input configured to receive the clock signal and comprising a third data input configured to receive a third input signal, wherein the third input signal comprises the second input signal having an adjusted duty cycle.

15. The digital phase detector, as set forth in claim 12, wherein each of the plurality of latches comprises a flip-flop.

16. A delay locked loop comprising:
   a first delay line comprising a plurality of delay units;
   a shift register coupled to the first delay line and configured to control an entry point of the delay line in response to a shift command; and
   a phase detector configured to provide the shift command to the shift register, wherein the phase detector comprises:
   a first latch comprising a first clock input configured to receive a clock signal and comprising
   a first data input configured to receive a first input signal;
      a second latch comprising a second clock input configured to receive the clock signal and comprising a second data input configured to receive a second input signal, wherein the second input signal comprises the first input signal having a delay added thereto; and
      a third latch comprising a third clock input configured to receive the clock signal and comprising a third data input configured to receive a third input signal, wherein the third input signal comprises the second input signal having an adjusted duty cycle.

17. The delay locked loop, as set forth in claim 16, comprising a pulse detector configured to receive each of the first input signal and the second input signal and further configured to determine whether a falling edge of the second input signal is within a time differential of a rising edge of the first input signal, wherein the time differential is approximately equal to a setup time of the third latch.

18. The delay locked loop, as set forth in claim 16, comprising a pulse generator configured to generate the third input signal if a falling edge of the second input signal is within the a time differential of a rising edge of the first input signal, wherein the time differential is approximately equal to a setup time of the third latch.

19. The delay locked loop, as set forth in claim 16, comprising a switch coupled to the output of the second latch and the output of the third latch and configured to provide a switch output comprising the output of the third latch if a falling edge of the second input signal is within a time differential of a rising edge of the first input signal and configured to provide a switch output comprising the output of the second latch if the falling edge of the second input signal is not within the time differential of a rising edge of the first input signal, wherein the time differential is approximately equal to a setup time of the third latch.

20. The delay locked loop, as set forth in claim 16, comprising a first delay element configured to add delay to a reference signal to compensate for processing, voltage and temperature (PVT) variations, wherein the reference signal having delay added thereto comprises the first input signal.

21. The delay locked loop, as set forth in claim 16, comprising a second delay element configured to add delay to the first input signal to create the second input signal, to provide a detect window in which phase matching may be detected.

22. The delay locked loop, as set forth in claim 16, wherein each of the first latch, the second latch and the third latch comprises a respective flip flop.

23. A method comprising:
   providing a clock signal to a respective clock input of a first latch of a phase detector, a second latch of the phase detector and a third latch of the phase detector;
   providing a first input signal to an input pin of the first latch;
   providing a second input signal to an input pin of the second latch;
   comparing a rising edge of the first input signal to a falling edge of the second input signal;
   generating a third input signal based on the comparing, if a predetermined relationship between the rising edge of the first input signal and the falling edge of the second input signal exits; and
   providing the third input signal to the third latch of the phase detector.

24. The method, as set forth in claim 23, further comprising:
   selecting an output of the first latch and an output of the third latch to obtain a command; and
   determining an action based on the command.

25. The method, as set forth in claim 24, wherein determining the action comprises shifting the second first input signal in time.

26. The method, as set forth in claim 23, wherein providing the first input signal comprises providing a feedback signal to the input pin of the first latch.

27. The method, as set forth in claim 26, wherein providing the second input signal comprises providing a delayed feedback signal to the input pin of the second latch, wherein the delayed feedback signal comprises the feedback signal having a delay added thereto.

28. The method, as set forth in claim 23, wherein comparing a rising edge of the first input signal to a falling edge of the second input signal, comprises measuring a time differential between the rising edge of the first input signal to the falling edge of the second input signal.

29. The method, as set forth in claim 28, wherein generating the third input signal comprises generating the third input signal if the time differential is less than approximately a setup time of the third latch.

30. The method, as set forth in claim 23, wherein generating the third input signal comprises generating a third input signal having a 50% duty cycle.

* * * * *